Nov. 3, 1959 H. H. BURTT ET AL 2,911,609

PRINTED CIRCUIT CARD CONNECTOR

Filed Sept. 29, 1955 2 Sheets-Sheet 1

INVENTORS
HORATIO H. BURTT
ROBERT A. FOWLER
& DONALD R. DeTAR
BY L. S. Saulsbury
ATTORNEY

PRINTED CIRCUIT CARD CONNECTOR

Filed Sept. 29, 1955 2 Sheets-Sheet 2

INVENTORS
HORATIO H. BURTT
ROBERT A. FOWLER
& DONALD R. DeTAR
BY
L. S. Saulsbury
ATTORNEY 2,911,609

PRINTED CIRCUIT CARD CONNECTOR

Horatio H. Burtt, Stamford, and Donald R. De Tar, Stratford, Conn., and Robert A. Fowler, Los Angeles, Calif.

Application September 29, 1955, Serial No. 537,398

1 Claim. (Cl. 339—17)

This invention relates to electrical connectors and more particularly to electrical connectors for receiving printed circuit cards.

While the techniques involved in printed circuitry have advanced at a rapid pace, the use of printed circuits in their practical application has lagged far behind. This is due in large part to the difficulties and expense inherent in the repair, assembly and replacement of the printed circuits.

Accordingly, it is a principal object of the present invention to provide a simple and efficient means for assembling, repairing and replacing equipment utilizing printed circuits.

It is another object of the present invention to provide an electrical connector which is adapted to frictionally engage and hold a printed circuit card.

It is still another object of the present invention to provide an electrical connector for printed circuit cards which includes polarizing means which may be selectively positioned.

It is a further object of the present invention to provide a highly improved electrical contact for the connector, which contact is adapted to frictionally and engagingly receive the printed card circuit.

It is a still further object of the invention to provide a printed circuit card connector in which the contacts can be made in mass production and by stamping from sheet metal.

It is a still further object of the invention to provide a connector which can be used for joining together two printed circuit cards.

It is still a further object of the present invention to provide an electrical connector of the type described which is simple and durable, which is effective for its intended purposes and which can be manufactured and sold at a reasonable cost.

For other objects and for a better understanding of the invention, reference may be had to the following detailed description taken in connection with the accompanying drawing, in which.

Figures 1, 2, 3, 4, 5:
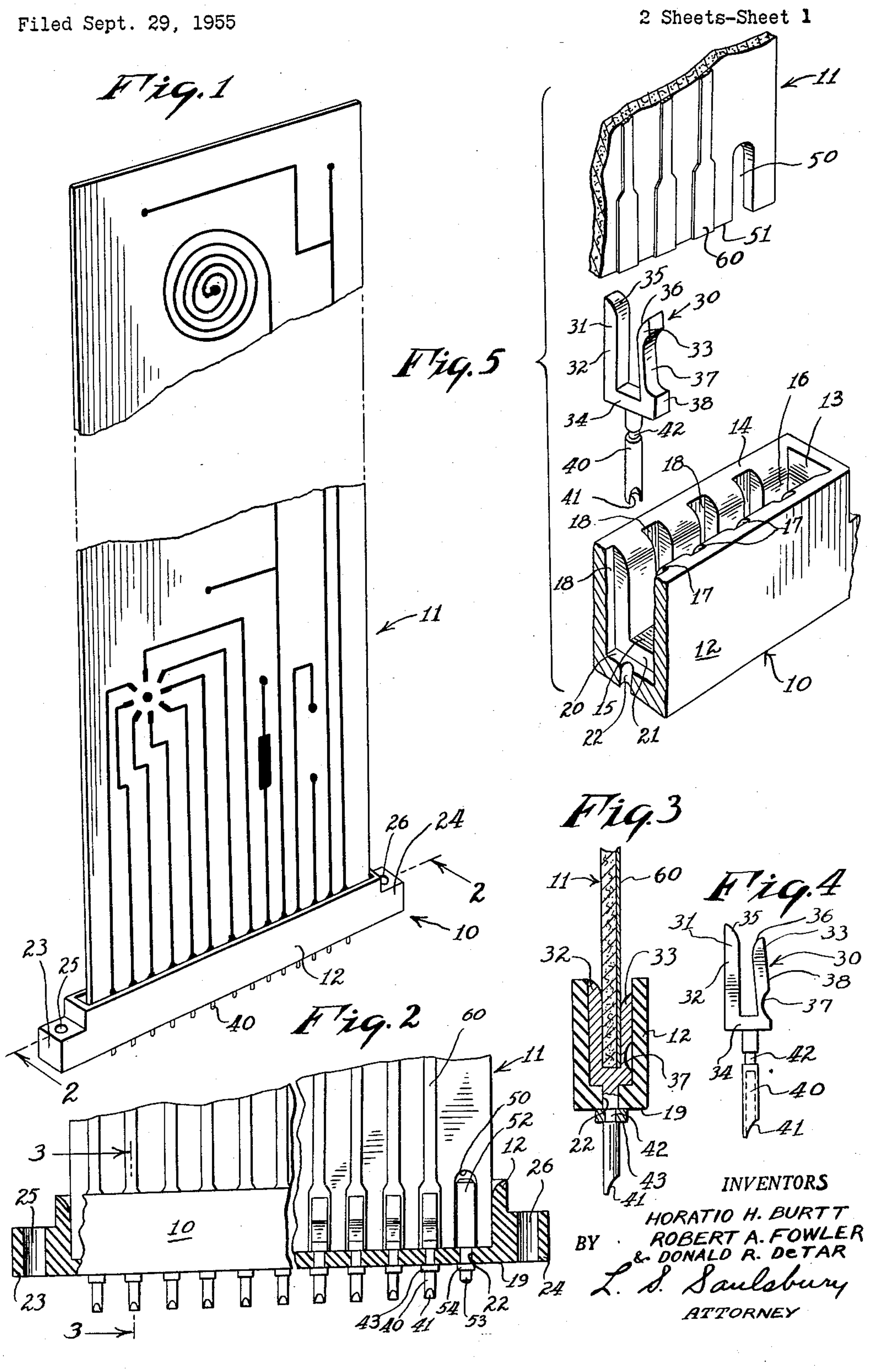
Figure 1 is a perspective view of a printed circuit card constructed according to one form of the present invention and showing inserted in the device a printed circuit card.
Fig. 2 is an enlarged fragmentary vertical sectional view taken on line 2—2 of Fig. 1.
Fig. 3 is an enlarged transverse vertical sectional view taken on the line 3—3 of Fig. 2.
Fig. 4 is an elevational view of one electrical contact used in the above one form of the invention.
Fig. 5 is an enlarged exploded fragmentary perspective view of the connector of the present invention.

Referring now more particularly to Figs. 1 to 5, 10 represents generally one form of the connector of the present invention and 11 represents a printed circuit card.

The connector 10 includes an elongated body 12 which is preferably made of plastic or other suitable insulating material, and which is formed with an elongated slot or groove 13 which extends inwardly from the open face 14 and terminates at the bottom end wall 15. The groove 13 is formed with a curved surface at 16 to smoothly meet the open face 14. Spaced from one another along the body 12, interiorly thereof, are a plurality of pairs of opposed side grooves 17 and 18 which extend inwardly from face 14 and open into the groove 13. The pairs of opposed grooves 17 and 18 extend inwardly to a point intermediate the bottom end wall 15 and the bottom exterior face 19 of the member 12 and terminate in a bottom end wall 20. A bottom cross groove 21 thus connects each pair of opposed grooves 17 and 18 and opens through the bottom end wall 15, the end walls 20 serving as the bottom walls of the cross grooves. In the bottom of each cross groove 21 is an aperture 22 which extends inwardly through the end wall 20 and opens through the bottom exterior face 19. The elongated body 12 has ears 23 and 24 at the respective opposite ends thereof, which ears are provided with through apertures 25 and 26 respectively.

Arranged within the slot or groove 13 of the body 12 are a plurality of electrical contacts generally designated at 30, Fig. 4. The contacts have a U-shaped or bifurcated portion 31 with opposed legs 32 and 33 and a bight portion 34 connecting the legs. The bifurcated contact 30 is formed of conductive metal, and the one leg 33 is slightly shorter in length than the other leg 32. The legs 32 and 33 are respectively formed with oppositely curved end surface portions 35 and 36 adjacent their respective free ends, and the leg 33 is provided with an outer cut out portion 37 on its outer edge 38. The cut out 37 effects the resiliency of the leg 33 toward and away from the leg 32, the degree of resiliency being determined by the size and shape of the cut out portion. Extending outwardly from the bight portion 34 of the U-shaped portion 31 is a terminal post or shank portion 40. The outer end of shank portion 40 is hollow and partially cut away on its end as at 41 for the ready reception of an electric wire. Intermediate the length of the terminal post 40 and spaced from the bight portion 34 is an annular groove 42 for a purpose to be described hereinafter. Thus, it is seen that an electrical contact has been provided that has one end bifurcated for frictionally engaging a printed circuit card.

A plurality of the contacts 30 are arranged within the body 12, each contact having its terminal post 40 extending through one aperture 22, the bight portion 34 seating in the cross groove 21 against the end wall 20, and the legs 32 and 33 respectively received within the respective adjacent grooves 18 and 17. The cut out free end 41 of the post 40 extends through and beyond the exterior face 19 of the body 12 for securement to an electric wire, and the annular groove 42 will lie adjacent the bottom exterior face 19. A C-shaped washer 43 is fitted into annular groove 42 and abuts the underface 19 of the body 12 to retain the contact in proper position within the body 12. It should now be apparent that an electrical connector is provided which will frictionally engage a printed circuit card when the latter is inserted therein.

In order to assure proper polarity upon the insertion of the printed circuit card 11 into the connector, the card 11 is provided with a slot or cut out portion 50 extending inwardly from its terminal end 51, Figs. 2 and 3. Arranged within the groove 13 of the body 12 is a wide pin 52 which has a reduced extension or shank 53 on one end, the reduced extension passing through and beyond one of the apertures 22. On extension 53 is a washer or other suitable securing means 54 which abuts the under face 19 to retain the pin 52 in place. The pin 52 will be received in the slot or cut out portion 50 and thereby assure proper polarity of the printed circuit card 11.

To mount the connector on a chassis, as desired, fastening elements are extended through the holes 25 and 26 of the respective ears 23 and 24. The number and arrangement of contacts may be selectively determined by the user.

Thus, it is seen that it is only necessary to insert the printed circuit card 11 into the groove 13 for making circuit connections. The insertion of the printed circuit card 11 urges the cut out leg 33 of the electrical contact 30 away from the resilient leg 32 and the leg 33 will frictionally engage a printed conductor 60 of the printed circuit card to hold the card in place in the connector. The cut out leg 33 is preferably shorter than the leg 32 to facilitate the insertion of the printed circuit card 11.

In Figs. 6 to 11, there is shown at 10′ a modified form of the present invention. A body 12′ is substantially the same as the body 12, previously described, with the exception of the aperture 22′ being of square configuration to receive a square terminal post or shank of the electrical contact 30′.

A printed circuit card 11′ extends beyond the ends of elongated slot or groove 13′ and the conductors 60′ are formed with apertures 60 to receive terminal posts. Large areas of conducting material may be provided on the card as indicated at 60*a*.

Figures 6, 7, 8, 9, 10, 11:
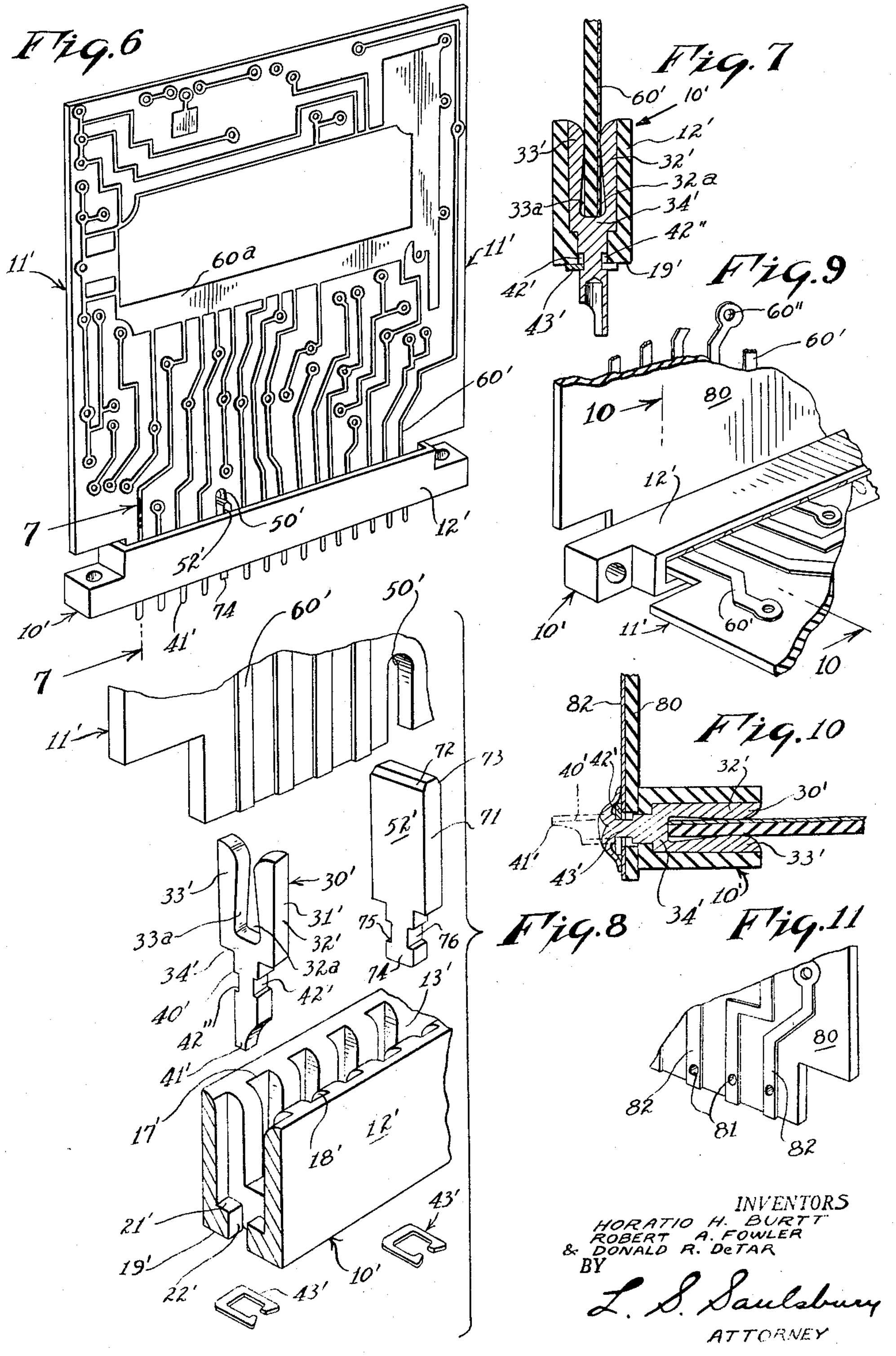
Fig. 6 is a perspective view of a different printed circuit card inserted in a connector constructed according to another form of the present invention.
Fig. 7 is an enlarged transverse vertical sectional view in elevation taken on the line 7—7 of Fig. 6.
Fig. 8 is an exploded fragmentary view and a perspective view of the printed circuit card and connector assembly of the form of the invention shown in Fig. 6.
Fig. 9 is an enlarged fragmentary perspective view taken showing the connector of the present invention connecting a pair of printed circuit cards.
Fig. 10 is a sectional view taken on the line 10—10 of Fig. 9.
Fig. 11 is a fragmentary prespective view of a printed circuit card adapted for connection to another printed circuit card through the connector of the present invention.

The electrical contact 30′, as seen in Fig. 8, comprises a U-shaped or bifurcated portion 31′ having a pair of opposed legs 32′ and 33′ of equal length. The legs are connected together by a bight portion 34′ and their inner sides or facing edges taper inwardly from the bight portion to their free ends. The facing edges of the legs 32′ and 33′ are respectively cut away as at 32*a* and 33*a* to gradually decrease the leg width, thereby to make them resilient and insure good contact with the printed card conductor 60′. Thus, the legs are resiliently yieldable toward and away from each other. Extending outwardly from the bight portion 34′ is a terminal post or shank portion 40′ which is of square cross section and provided intermediate its ends and on opposite edges thereof with transversely-extending open ended slots 42′ and 42″. The free ends 41′ of the shank portion 40′ are cut out to facilitate the connection of an electrical conductor thereto. This form of contact has been found well adapted for mass production stamping methods.

A modified form of polarizing pin 52′ is illustrated in Fig. 8. This polarizing pin is fabricated of a single sheet of material and includes a flat elongated body portion 71 having transverse edges chamfered adjacent one end as indicated at 72 and 73. Formed on the other end is a longitudinally-extending shank portion 74 having a square cross section, and with transversely extending open ended slots 75 and 76 disposed respectively in the respective edges thereof. The card has a slot 50′ to receive the polarizing pin 52′.

A plurality of contacts 30′ are disposed within the body 12′, each contact having its terminal post or shank portion 40′ extending through one of the apertures 22′, the bight portion 34′ seating in a bottom groove 21′ and the legs 32′ and 33′ respectively seating in the respective opposing grooves 18′ and 17′. The open ended slots 42′ and 42″ lie adjacent under face 19′ of the body 12′, and a C-shaped spring washer 43′ having a square opening is snapped about the terminal post portion 40′ with its arms disposed within the slots 42′ and 42″ and one side abutting the face 19′ of the body 12′ whereby to retain the contact in place therewithin.

Similarly, the polarizing pin 52′ has its shank portion 74 extending through one of the apertures 22′ and secured therein by one of the C-shaped spring washers 43′. This pin 52′ thus insures the proper polarity of the conductors of the printed circuit card when the card is inserted in the connector.

Under certain circumstances, it may be desirable to use the connector of the present invention for connecting a pair of printed circuit cards. Such an arrangement is shown in Figs. 9, 10 and 11. To effect this end, it is only necessary to form a printed circuit card 80, Fig. 11, on its connecting end with a plurality of apertures 81, Fig. 11, respectively arranged to extend through the conductors 82 as well as the circuit card 80, whereby the protruding terminal posts or shank portions 40 of the contacts 30 may extend through and beyond the apertures 81. The card 80 is positioned in abutting position in engagement with the undersurface 19′ of the body 12′, and the washers 42′ are fitted in the slots 75 and 76 engaging the contact 30 and the conductor 82, as seen in Fig. 5. If it is desired to permanently retain the printed circuit card 80 in connection with the connector 10′, the projecting end 41′ of the terminal post or shank portion 40′ is upset against the card 80 to clamp the card in position. It is thus apparent that the connector of the present invention may be adapted for coupling a pair of printed circuit cards and the cards mounted together by the connector 10′ to a chassis.

While various changes may be made in the detail construction, it shall be understood that such changes shall be within the spirit and scope of the present invention as defined by the appended claim.

What is claimed is:

An electrical connector comprising an insulating body having a main groove extending inwardly from one face and terminating in an end wall spaced from the other face, said body being provided with at least one pair of opposed side grooves extending inwardly from said one face opening into said main groove and a bottom groove cooperating therewith, a bifurcated contact arranged within said main groove and having its legs in the respective opposed side grooves and a bight portion joining the legs and lying in the cooperating bottom groove and a terminal post portion on the bight portion of said bifurcated contact extending through said body beyond said other face thereof, one of the legs of the bifurcated contact being shorter than the other and cut away on its side to render it more resilient the ends of said legs being respectively oppositively rounded, whereby to facilitate the entrance of the printed circuit card into the main groove.

References Cited in the file of this patent

UNITED STATES PATENTS

| | | |
|---|---|---|
| 1,635,056 | Paiste | July 5, 1927 |
| 1,716,144 | Morrison | June 4, 1929 |
| 2,532,538 | Burtt et al. | Dec. 5, 1950 |
| 2,613,244 | Del Camp | Oct. 7, 1952 |
| 2,664,552 | Ericsson et al. | Dec. 29, 1953 |
| 2,699,534 | Klostermann | Jan. 11, 1955 |
| 2,701,346 | Powell | Feb. 1, 1955 |
| 2,747,167 | Parrish | May 22, 1956 |
| 2,765,450 | Richardson | Oct. 2, 1956 |

OTHER REFERENCES

Buggie: HHB No. 3371 (page 3) Jan. 8, 1954.